(12) United States Patent
Burl et al.

(10) Patent No.: US 6,320,385 B1
(45) Date of Patent: Nov. 20, 2001

(54) MULTI-CHANNEL BALUN FOR MAGNETIC RESONANCE APPARATUS

(75) Inventors: Michael Burl, Chagrin Falls; Thomas Chmielewski, Willoughby Hills; William O. Braum, Twinsburg, all of OH (US)

(73) Assignee: Picker International, Inc., Highland Heights, OH (US)

( * ) Notice: Subject to any disclaimer, the term of this patent is extended or adjusted under 35 U.S.C. 154(b) by 0 days.

(21) Appl. No.: 09/399,292

(22) Filed: Sep. 17, 1999

(51) Int. Cl.[7] ............................. G01V 3/00; G01R 33/20
(52) U.S. Cl. ............................................. 324/322
(58) Field of Search .................... 324/307, 309, 324/311, 312, 313, 314, 318, 320, 322

(56) References Cited

U.S. PATENT DOCUMENTS

| | | | |
|---|---|---|---|
| 4,707,662 | 11/1987 | Kemner et al. | 324/322 |
| 4,725,780 | 2/1988 | Yoda et al. | 324/322 |
| 4,793,356 | 12/1988 | Misic et al. | 324/318 |
| 4,839,594 | 6/1989 | Misic et al. | 324/318 |
| 4,859,950 | 8/1989 | Keren | 324/322 |
| 4,918,388 | 4/1990 | Mehdizadeh et al. | 324/322 |
| 4,920,318 | 4/1990 | Misic et al. | 324/318 |
| 4,922,204 | 5/1990 | Duerr et al. | 324/322 |
| 5,144,240 | 9/1992 | Mehdizadeh et al. | 324/318 |
| 5,280,248 | 1/1994 | Zou et al. | 324/318 |

FOREIGN PATENT DOCUMENTS

| | | |
|---|---|---|
| 07 136145 | 5/1995 | (JP) . |
| 10 126196 | 5/1998 | (JP) . |
| 11 056812 | 3/1999 | (JP) . |

*Primary Examiner*—Hezron Williams
*Assistant Examiner*—Tiffany A. Fetzner
(74) *Attorney, Agent, or Firm*—Fay, Sharpe, Fagan, Minnich & McKee, LLP

(57) ABSTRACT

A multi-channel balun (70, 72) blocks stray RF current from flowing on shield conductors of coaxial RF cables of a magnetic resonance apparatus. The balun comprises a parallel combination of an even number of helical coils of shielded transmission cable (L10, L12; L14, L16, L18, L20) wound in alternate directions such that voltages iduced by their external RF fields cancel. One capacitor (C10; C16, C18) is connected in parallel symmetrically with each pair of helical coils, with trim capacitors (C12; C22) fixed in the coil plug (86, 90) to retune the balun as required. The multi-channel balun (70, 72) accommodates magnetic resonance systems with an odd or even number of channels without requiring shielding. Preferably, the balun (70, 72) is constructed on a single circuit board in a close-packed relationship that is compact and space efficient, yet provides better decoupling from the transmit field.

15 Claims, 2 Drawing Sheets

MULTI-CHANNEL BALUN FOR MAGNETIC RESONANCE APPARATUS

BACKGROUND OF THE INVENTION

The present invention relates to the radio frequency signal handling arts. It finds particular application in conjunction with medical magnetic resonance imaging systems and will be described with particular reference thereto. It is to be appreciated, however, that the invention will also find application in conjunction with other types of magnetic resonance imaging systems, magnetic resonance spectroscopy systems, and the like.

In magnetic resonance imaging, a strong uniform static magnetic field $B_0$ is generated, often by a superconducting magnet. The static magnetic field $B_0$ polarizes the nuclear magnetic spin system of an object to be imaged. Superconducting magnets are commonly wound on a cylindrical body former mounted in an annular helium vessel surrounded by an annular vacuum vessel for thermal isolation. The superconducting magnet generates the static magnetic field, $B_0$, along its own longitudinal axis and the common longitudinal axis of the cylindrical bore of the vacuum vessel, commonly denoted as the z-axis. Alternately, the $B_0$ field is generated in an open region between a pair of poles. Often, a ferrous flux return path is provided between the poles remote from the open imaging region.

To generate a magnetic resonance signal, the polarized spin system is first excited by applying a magnetic resonance excitation signal or radio frequency field $B_1$, perpendicular to the z-axis. This RF field $B_1$ is typically produced by an RF coil located inside the bore of a bore-type magnet or adjacent the pole of an open magnet and closely conforming thereto to maximize the space available to receive a patient. The RF magnetic field is turned on and off to create short RF pulses to excite and manipulate magnetization in the polarized object in the bore. More specifically, the RF excitation pulses tip the magnetization out of alignment with the z-axis and cause its macroscopic magnetic moment vector to precess around the z-axis. The precessing magnetic moment, in turn, generates a radio frequency magnetic resonance signal that is received by the RF coil in a reception mode. Additional RF pulses are commonly applied to manipulate the resonance to form enhanced signal strength RF echoes which are received by the same RF coil or a local RF coil positioned near a region of interest.

In magnetic resonance imaging, it is advantageous for the RF coil to have high sensitivity, high RF power efficiency, and a high signal-to-noise ratio. Also, the $B_1$ magnetic field which is generated should be uniform. The sensitivity of the RF coil is defined as the magnetic field $B_1$ created by a unit current. The signal-to-noise ratio is proportional to the sensitivity and to the square root of the coil quality factor, Q.

To encode a sample spatially, magnetic field gradients are applied after the RF excitation. The gradient magnetic fields are typically applied in pulses to generate magnetic field gradients $G_x$, $G_y$ and $G_z$ linearly along the x, y, and z-directions, respectively, or other selected coordinate system. The gradient pulses typically are generated by gradient magnetic field coils which are also located inside the bore of a bore-type magnet or adjacent the poles of an open-type magnet. Commonly, the gradient field coils are mounted in back of the RF coil in the bore or on the pole piece.

A radio frequency coil is also used to receive magnetic resonance signals emanating from a patient's body. These receive coils may be local coils, such as for receiving RF signals from a patient's head or the larger whole body RF coils located in the bore or on the pole pieces. The local coils can also be used in a transmit mode. The receive coils are typically operable in a quadrature mode. Some local coils include an array or other plurality of RF coils. The signals are then demodulated by a receiver, preferably a digital receiver.

A sequence control circuit controls the gradient pulses and the transmitter to generate a plurality of imaging sequences. For the selected sequence, the receive coil receives one or a plurality of data lines in rapid succession following each RF excitation pulse. Gradient pulses are typically applied before and during reception of resonance echoes and between echoes in multi-echo sequences. An analog-to-digital converter converts each data line to a digital format. Ultimately, the radio frequency signals are demodulated and reconstructed into an image representation by a reconstruction processor which applies a two-dimensional Fourier transform or other appropriate reconstruction algorithm. The image may represent a planar slice through the patient, an array of parallel planar slices, a three-dimensional volume, or the like.

Radio frequency coils in magnetic resonance systems are generally connected to the magnetic resonance system, and more particularly to the RF transmitter and/or the RF receiver of the magnetic resonance system using coaxial cable. Coaxial cable protects the system from picking-up extraneous RF signals which are present in the environment. As is well known, coaxial cable features a surrounding shield or ground conductor separated from a current carrying central conductor by a dielectric material. The surrounding conductor acts as a shield that minimizes the pick-up of foreign frequencies by the cable.

Although coaxial cable is used, there are still coupling problems at resonance frequencies, such as 64 MHZ for hydrogen dipoles in a 1.5 T $B_0$ field. Among other things, the shield conductor of the coaxial cable itself tends to carry foreign induced currents, such as from TV transmissions, stray harmonics from the gradient pulse oscillators and clocking circuits in nearby equipment, and the like. The induced current is often referred to as "skin current" because it flows on the outside of the shield conductor. The stray RF current tends to flow out of the bore and into other circuits, such as the amplifiers, analog-to-digital converters, receiver, and reconstruction processor to contribute errors in the resultant image.

Balance/unbalance ("Balun") circuitry is used as one means for reducing the noise and/or stray RF currents generated due to induced currents in the coaxial cable. Baluns of the prior art consisted of a cable or tube (often on the order of 1.0 m) that fed into and out of a copper shielded box. The balun was tuned to the frequency of interest, such as by a tuning capacitor. The baluns of the prior art are problematic for a number of reasons. First, the baluns are expensive due to the use of special non-magnetic tuning capacitors. Second, these baluns are inaccessible and sealed which prevents tuning for different coil arrangements or frequencies. Third, these baluns are space consuming. In magnetic resonance scanners, there are severe space limitations. In bore type magnets, there is pressure to reduce the magnet diameter for lower cost competing with pressure to enlarge the patient receiving bore. Similarly, in open magnets, there are competing pressures to move pole pieces closer and to enlarge the patient gap. This compresses the space available for RF coils, gradient coils, shims, baluns, and other associated structures.

Compounding the aforementioned disadvantages, magnetic resonance scanners have multiple RF output channels, such as a channel for each quadrature mode, channels for individual coils of an array, or the like. One or more baluns are incorporated in each channel. The multiple connection of parallel baluns reduces their effectiveness to block RF current. Also, space consuming problems are magnified when multiple baluns are used. Finally, multiple baluns multiply the cost.

The present invention contemplates a new and improved balun design which overcomes the above-referenced problems and others.

SUMMARY OF THE INVENTION

In accordance with one aspect of the present invention, a magnetic resonance apparatus is provided. It includes a main magnet which generates a main magnetic field through an examination region. It further includes at least one RF coil assembly positioned adjacent the examination region and a radio frequency transmitter which drives the RF coil assembly to excite magnetic resonance dipoles disposed therein. A multi-channel receiver which receives and demodulates magnetic resonance signals is connected to the RF coil assembly by shielded transmission cables. A multi-channel balun which blocks stray induced RF currents and noise from entering the receiver is connected with shielded transmission cables. The multi-channel balun includes a parallel combination of at least two helical coils wound of shielded transmission cable which are wound in opposite directions. The balun further includes at least one capacitor connected in parallel with the helical coils.

In accordance with another aspect of the present invention, a method for blocking stray RF currents from flowing in signal cables carrying RF data of a selected frequency spectrum in a magnetic resonance apparatus is provided. The method includes winding at least two helical coils of shielded transmission cable in opposite directions and connecting the helical coils in parallel. The parallel combination of helical coils is then tuned to the selected RF data frequency spectrum. RF data is then passed along inner conductors of the two helical coils such that stray RF currents on outer shield conductors of the signal cables are blocked.

In accordance with another aspect of the present invention, a multi-channel balun for blocking stray RF current from flowing in RF lines is provided. The multi-channel balun includes a parallel combination of at least a first helical coil wound of shielded transmission cable and a second helical coil wound of shielded transmission cable where the helical coils are wound in opposite directions. The multi-channel balun further includes at least one capacitor connected in parallel with the first and second helical coils.

One advantage of the present invention is that it maintains a high Q factor.

Another advantage of the present invention resides in its compactness and space efficiency.

Another advantage of the present invention is that no shielding is necessary with the balun.

Another advantage of the present invention is that it provides better decoupling from the transmit field.

Yet another advantage of the present invention is that the balun is tuned easily to compensate for coil differences.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
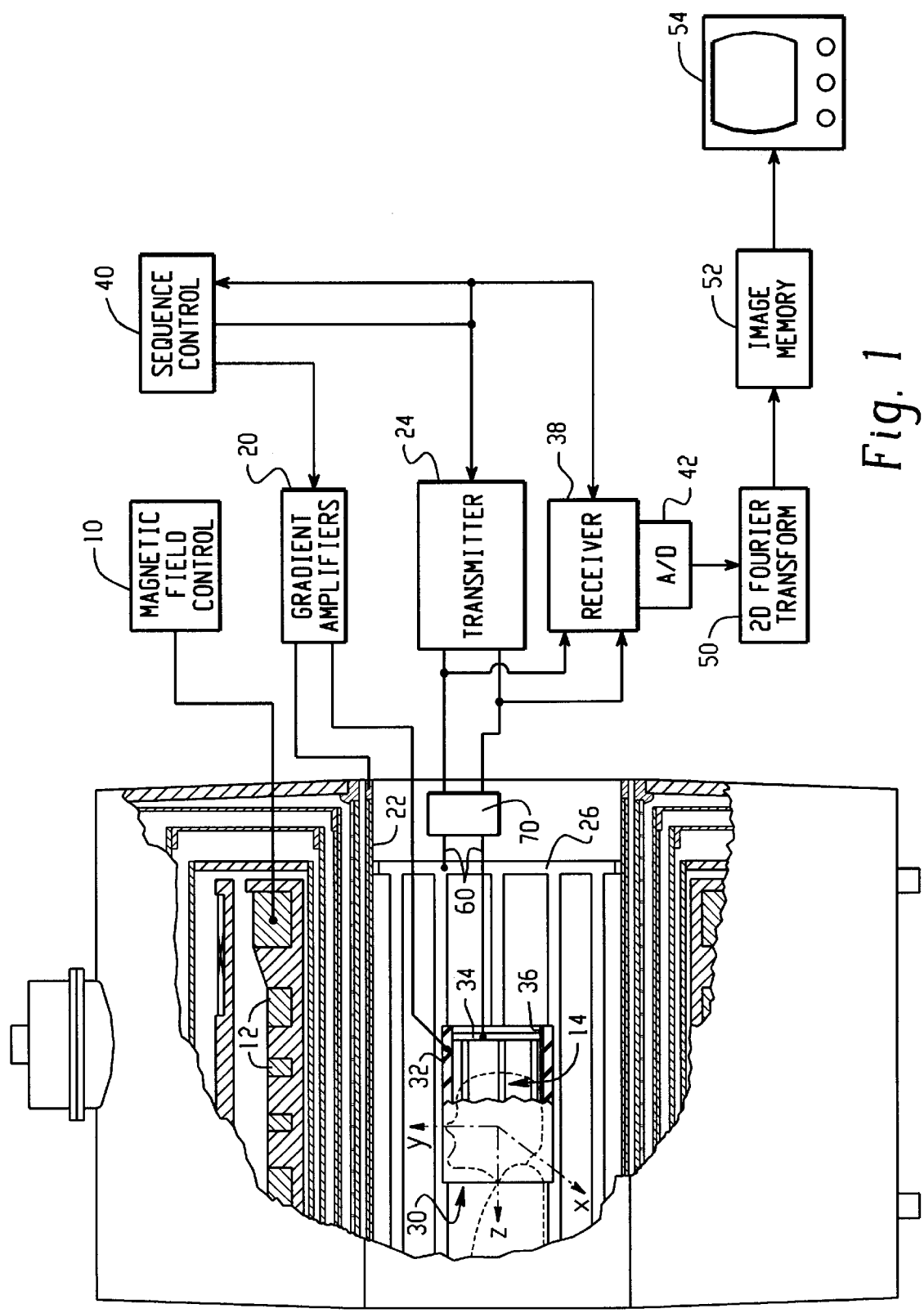
FIG. 1 is a diagrammatic illustration of a magnetic resonance imaging apparatus employing the multi-channel balun in accordance with the present invention.

With reference to FIG. 1, a main magnetic field control 10 controls superconducting or resistive magnets 12 such that a substantially uniform, temporally constant main magnetic field is created along a z-axis through an examination region 14. Although a bore-type magnet is illustrated in FIG. 1, it is to be appreciated that the present invention is equally applicable to open magnet systems. A magnetic resonance sequence control applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences. More specifically, gradient pulse amplifiers 20 apply current pulses to selected ones or pairs of whole body gradient coils 22 to create magnetic field gradients along x, y and z-axes of the examination region 14. A digital radio frequency transmitter 24 transmits radio frequency pulses or pulse packets to a whole-body quadrature RF coil 26 to transmit RF pulses into the examination region. A typical radio frequency pulse is composed of a packet of immediately contiguous pulse segments of short duration which taken together with each other and any applied gradients achieve a selected magnetic resonance manipulation. The RF pulses are used to saturate, excite resonance, invert magnetization, refocus resonance, or manipulate resonance in selected portions of the examination region. For whole-body applications, the resonance signals are commonly picked up in quadrature by the whole body RF coil 26.

For generating images of limited regions of the subject, local coils are commonly placed contiguous to the selected region. For example, an insertable head coil 30 is inserted surrounding a selected brain region at the isocenter of the bore. The insertable head coil preferably includes local gradient coils 32 which receive current pulses from the gradient amplifiers 20 to create magnetic field gradients along x, y, and z-axes in the examination region within the head coil. A local quadrature radio frequency coil 34 is used to excite magnetic resonance and receive magnetic resonance signals emanating from the patient's head. Alternatively, a receive-only local radio frequency coil can be used for quadrature reception of resonance signals introduced by body-coil RF transmissions. An RF screen 36 screens the RF signals from the RF head coil from inducing any currents in the gradient coils and the surrounding structures. The resultant radio frequency signals are picked up in quadrature by the whole body RF coil 26, the local RF coil 34, or other specialized RF coils and demodulated by a receiver 38, preferably a digital receiver.

A sequence control processor 40 controls the gradient pulse amplifiers 20 and the transmitter 24 to generate any of a plurality of magnetic resonance imaging and spectroscopy sequences, such as echo-planar imaging, echo-volume imaging, gradient and spin echo imaging, fast spin echo imaging, and the like. For the selected sequence, the receiver 38 receives a plurality of data lines in rapid succession following each RF excitation pulse. An analog-to-digital converter 42 converts each data line to a digital format. The analog-to-digital converter 42 is disposed between the radio frequency receiving coil and the receiver 38 for digital receivers and is disposed down stream (as illustrated) from the receiver for analog receivers. Ultimately, the radio frequency signals received are demodulated and reconstructed into an image representation by a reconstruction processor 50 which applies a two-dimensional Fourier transform or other appropriate reconstruction algorithm. The image may represent a planar slice through the patient, an array of parallel planar slices, a three-dimensional volume, or the like. The image is then stored in an image memory 52 where it may be accessed by a display, such as a video monitor 54 which provides a human-readable display of the resultant image.

With continuing reference to FIG. 1, the radio frequency coils 26, 34 in the magnetic resonance imaging system are connected to the RF transmitter 24 and/or the RF receiver 38 by RF lines or cables 60. Preferably, the RF lines 60 are coaxial cable. Such coaxial cable protects the system from picking up extraneous RF signals and noise which are present in the environment.

Typically, coaxial cable features a braided, tubular conductor which is separated from a current-carrying central conductor by a dielectric material. The tubular outer conductor is grounded to act as a shield that minimizes the pick-up of foreign frequencies by the central conductor.

Although coaxial cable is used, there are still coupling problems at high frequencies associated with magnetic resonance imaging and spectroscopy. Among other things, the braiding of the coaxial cable itself tends to carry foreign induced currents or "skin currents." The stray RF current tends to flow along the cable out of the bore and into other circuits in the magnetic resonance apparatus.

A multi-channel balun 70 is incorporated into each RF line 60 around the point that it leaves the RF magnetic field to keep stray RF from flowing out of the bore. The multi-channel balun 70 blocks stray RF currents in each of the RF lines 60. As illustrated in FIG. 1, the multi-channel balun 70 is incorporated into each RF line 60 at a point near where the line leaves the RF magnetic field between the RF coil assembly 26 and the receiver 38. Optionally, additional baluns are incorporated at the RF coil assembly 26, 34, just outside the bore of the magnetic resonance imaging apparatus, just before the receiver 38 and at intervals between the bore and the receiver 38. Preferably, only one multi-channel balun 70 is incorporated into the RF lines 60 adjacent the edge of the RF magnetic field. Incorporating multiple multi-channel baluns between the RF coil assembly and the receiver 38 filters stray RF currents as they are received without letting them accumulate and interact.

Figures 2A, 2B:
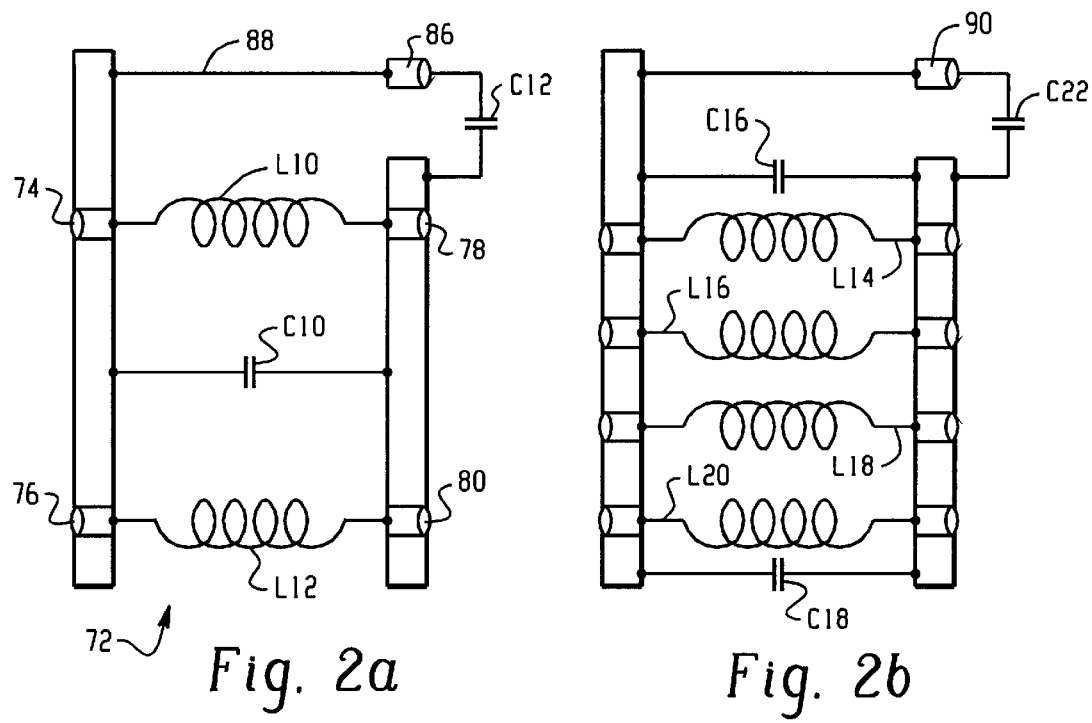
FIG. 2a is a diagrammatic illustration of a multi-channel balun in accordance with the present invention.
FIG. 2b is a diagrammatic illustration of a four-channel balun in accordance with the preferred embodiment of the present invention.

With reference to FIG. 2a and continuing reference to FIG. 1, a two-channel balun 72 includes two helical coils wound of shielded transmission cable, L10, L12 which are connected in parallel. The helical coils are wound in opposite directions with the same number of windings, e.g. with the first helical coil L10 being wound right-handed and the second helical coil L12 being wound left-handed:

Preferably, the helical coils L10, L12 are solenoidal inductors which are wound out of semi-rigid coaxial cable. Alternately, the helical coils may be wound of triaxial cable or twinaxial cable. Winding the helical coils L10, L12 in opposite directions and placing them next to one another in a parallel connection causes the induced voltages from the external RF fields to cancel each other, provided that the helical coils L10, L12 are the same or similar size and geometry. This benefit alleviates the need for copper foil shielding. In this manner, a higher Q is maintained.

For the 2-channel balun 72, a capacitor C10 is connected in parallel with the combination of the first and second helical coils L10, L12. The capacitor C10 is used to tune the parallel network of inductors L10, L12 to the working frequency of the system. Preferably, the tuning capacitor C10 is positioned symmetrically between the two coax inductors L10, L12 because the external RF field cancels in the center of the two coax inductors L10, L12. In addition to the aforementioned tuning capacitor C10, a fine tuning capacitor C12 is mounted in a coil plug dummy connector 86 as shown in FIG. 2a. Each multi-channel balun 72 contains an extra dummy connector 86 which connects to a straight wire or straight piece of coaxial cable 88. The fine tuning capacitor C12 allows for external tuning of the balun for any type of coil that may be used in the system. The trim capacitor C12 is a small value, high voltage capacitor that is preselected for each coil type. The configuration shown in FIG. 2a has the dual benefit of avoiding mode splitting from the inductors coupling to one another and avoiding induced voltages in the inductors from coupling with the $B_1$ field.

This construction enables multiple baluns to be constructed on a single circuit board in a close-packed relationship. The two-channel balun 72 has coaxial cable connectors 74, 76, 78, 80 which provide for simple mechanical interfacing with the coaxial cable of the RF lines 60. There is one input connector and one output connector for each channel of the magnetic resonance imaging apparatus.

With reference to FIG. 2b, the magnetic resonance imaging machine illustrated in FIG. 1 has four RF input channels. The single balun 70 includes a parallel combination of four inductors L14, L16, L18, L20 wound out of semi-rigid coaxial cable. The inductors L14–L20 are wound in alternating directions, such that the overall RF field cancels as in the two-channel balun 72 of FIG. 2a. In order to tune the four inductors L14, L16, L18, L20 connected in parallel to work as one inductor, a symmetrical arrangement of tuning capacitors C16, C18 is connected in parallel with the inductors L14, L16, L18, L20, along with a corresponding trim capacitor C22 mounted on the coil plug 90, as shown in FIG. 2b. Alternatively, a single capacitor may be connected in parallel with the inductors L14, L16, L18, L20 and placed between the inductors L14, L16, L18, L20 similar to the configuration in FIG. 2a, along with a corresponding trim capacitor.

Figure 3A:
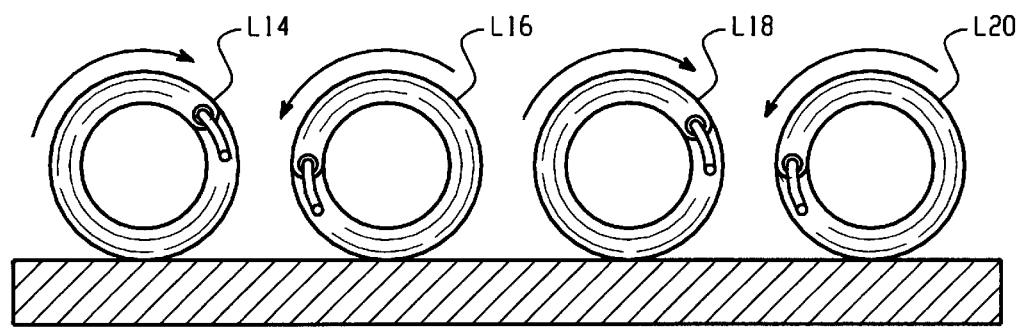
FIGS. 3a and 3b are diagrammatic illustrations of alternative winding patterns for a multi-channel balun in accordance with the present invention.
Figure 3B:
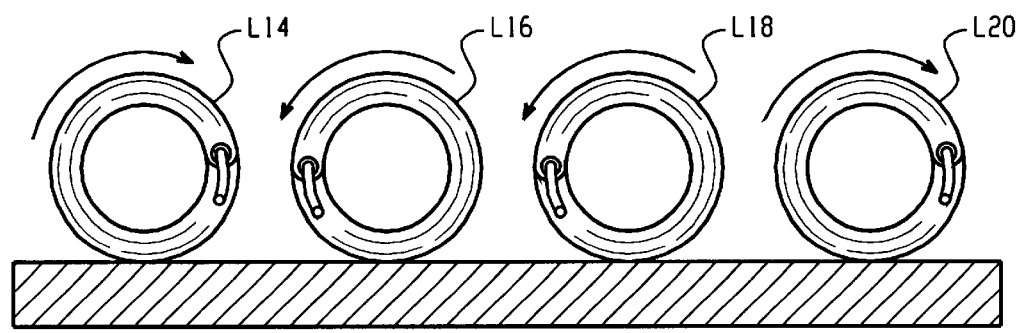

With reference to FIGS. 3a and 3b and continuing reference to FIG. 2b, side views of four-channel baluns with alternate winding patterns are shown. Both of these patterns are effective for canceling the external RF fields of the coils. In FIG. 3a, the four coils L14, L16, L18, L20 are wound with the following pattern: clockwise, counterclockwise, clockwise, counterclockwise. In FIG. 3b, the four coils L14, L16, L18, L20 with the following pattern: clockwise, counterclockwise, counterclockwise, clockwise. The balun 70 can be extended to 6, 8, . . . , 2N channels analogously.

In an alternative embodiment, a multi-channel balun is constructed for an odd number of channels. Two methods may be employed to adapt an even-channel balun to a magnetic resonance system with an odd number of channels. First, a dummy winding may be used. In this case, the unused winding is preferably a solid conductor, but the same coax cable as the other coils is also contemplated. Alternatively, a balun can be made for an odd number of channels greater than 2 by using windings of different sizes to balance the coupling flux from the external field.

In this manner, two or more channels can be handled by a balun which is constructed on a single circuit board in a close-packed relationship that is nearly the size of a prior single balun. In addition, the multi-channel balun can be used for a large number of channels while maintaining a relatively high Q factor. The omission of external shielding maintains a relatively high Q factor. Further, the multi-channel balun can be tuned externally without difficulty.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance apparatus having a main magnet which generates a main magnetic field through an examination region, at least one RF coil assembly positioned adjacent the examination region, a radio frequency transmitter which drives the RF coil assembly to excite magnetic resonance dipoles in a RF transmit field within the examination region, a multi-channel receiver connected by shielded transmission cables to the at least one RF coil assembly which receives and demodulates the magnetic resonance signals, a multi-channel balun connected with the shielded transmission cables between the RF coil assembly and the multi-channel receiver to block stray induced RF currents and noise from entering the receiver, the multi-channel balun comprising:

a parallel combination of at least two helical coils wound of shielded transmission cable such that the helical coils are shielded against picking up RF fields, said helical coils being wound in opposite directions; and at least one capacitor connected in parallel with said helical coils.

2. The magnetic resonance apparatus according to claim 1, wherein the shielded transmission cable is one of coaxial cable, triaxial cable, and twinaxial cable.

3. The magnetic resonance apparatus according to claim 1, wherein said balun is located adjacent an edge of the RF transmit field.

4. The magnetic resonance apparatus according to claim 1, said multi-channel balun further comprising:

a trim capacitor for retuning the multi-channel balun, said trim capacitor being mounted on a coil plug.

5. A magnetic resonance apparatus having a main magnet which generates a main magnetic field through an examination region, at least one RF coil assembly positioned adjacent the examination region, a radio frequency transmitter which drives at least one RF coil of the at least one RF coil assembly to excite magnetic resonance dipoles in a RF transmit field within the examination region, a multi-channel receiver connected by shielded transmission cables to a plurality of RF coils of the at least one RF coil assembly which receives and demodulates the magnetic resonance signals, a multi-channel balun connected with the shielded transmission cables between the RF coil assembly and the multi-channel receiver to block stray induced radio frequency currents and noise from entering the channels of the multichannel receiver, the multi-channel balun comprising:

a parallel combination of a plurality of helical coils wound of shielded cable, such that the helical coils are shielded against picking up RF fields, said helical coils being wound in opposite directions, each helical coil being connected with a corresponding shielded transmission cable; and at least one capacitor connected in parallel with and symmetrically between said helical coils.

6. The magnetic resonance apparatus according to claim 1, wherein the helical coils are of similar geometry.

7. The magnetic resonance apparatus according to claim 1, wherein the RF coil assembly receives in quadrature and is connected with two coaxial cables, one for carrying each quadrature channel; the two helical coils are connected in parallel, each helical coil connected to one of the coaxial cables.

8. The magnetic resonance apparatus according to claim 1, wherein there are an even number of helical coils, which helical coils positioned next to one another having alternate winding directions, such that voltages induced by their respective RF fields cancel.

9. A multi-channel balun for blocking stray RF current from flowing in RF lines, said multi-channel balun comprising: a parallel combination of at least a first helical coil wound of shielded transmission cable and a second helical coil wound of shielded transmission cable, said helical coils being wound in opposite directions such that the helical coils are shielded against picking up RF fields; and at least one capacitor connected in parallel with said helical coils.

10. The multi-channel balun according to claim 9, wherein the shielded transmission cable is one of coaxial cable, triaxial cable, and twinaxial cable.

11. The multi-channel balun according to claim 9, wherein said capacitor is located symmetrically between said first helical coil and said second helical coil.

12. A multi-channel balun for blocking stray RF currents from flowing in RF lines, said multi-channel balun comprising:

a parallel combination of an even number of helical coils wound of shielded transmission cable, which coils are positioned next to one another having alternate winding directions, such that voltages induced by their respective RF fields cancel with no additional RF fields being received; and, at least one capacitive element connected in parallel with said helical coils.

13. A method for blocking stray RF currents from flowing in signal cables carrying RF data of a selected frequency spectrum in a magnetic resonance apparatus, said method comprising:

winding at least two helical coils of shielded transmission cable in opposite directions, such that the helical coils are shielded against picking up RF fields; and connecting said helical coils in parallel;

tuning the parallel connected helical coils to the selected RF data frequency spectrum; and passing RF data along inner conductors of the two helical coils such that stray RF currents on outer shield conductors of the signal cables are blocked.

14. The method according to claim 13, wherein the shielded transmission cable is one of coaxial cable, triaxial cable, and twinaxial cable.

15. The method according to claim 13, wherein the tuning step includes:

adjusting a capacitance in parallel with the helical coils, said capacitance connected through a coil plug.

* * * * *